United States Patent [19]
Volckart et al.
[11] 3,716,846
[45] Feb. 13, 1973

[54] CONNECTOR SHEET WITH CONTACTS ON OPPOSITE SIDES

[75] Inventors: Peter Volckart, Bruchkopel; Hartmut Lehmann, Burgberg; Raimund Hafner, Dauchingen, all of Germany

[73] Assignee: Kienzle Apparate GmbH, Villingen Schwarzwald, Germany

[22] Filed: Jan. 18, 1971

[21] Appl. No.: 107,366

[30] Foreign Application Priority Data

Jan. 24, 1970 Germany....................P 20 03 225.1

[52] U.S. Cl.........340/174 M, 174/68.5, 317/101 CE, 317/101 CM, 317/101 F, 340/174 MA

[51] Int. Cl. ..........................G11c 11/02, H05k 1/00

[58] Field of Search ......174/68.5; 317/101 B, 101 C, 317/101 CC, 101 CM, 101 D, 101 F, 101 DH, 101 CE; 340/174 M, 174 MA

[56] References Cited

UNITED STATES PATENTS

| | | | |
|---|---|---|---|
| 2,911,605 | 11/1959 | Wales, Jr. | 317/101 F X |
| 3,152,288 | 10/1964 | Mittler | 317/101 D X |
| 3,221,286 | 11/1965 | Fedde | 317/101 D X |
| 3,248,779 | 5/1966 | Yuska et al | 317/101 CC X |
| 3,474,297 | 10/1969 | Bylander | 317/101 CE |

*Primary Examiner*—Bernard A. Gilheany
*Attorney*—Michael S. Striker

[57] ABSTRACT

A connector sheet or band with a printed circuit or other conductors only on the front face, has a marginal portion bent along a fold line upon the rear surface. Input and output connectors extending across the fold line are arranged symmetrical to the same and form registering electrically connected contact portions in the front and the rear of the connector sheet abutting corresponding contact portions of other connector sheets when a stack of connector sheets is formed.

13 Claims, 4 Drawing Figures

PETER VOLCKART
HARTMUT LEHMANN
REIMUND HAFNER
INVENTORS

BY [signature]
ATTORNEY

PETER VOLCKART
HARTMUT LEHMANN
REIMUND HAFNER
INVENTORS

BY [signature]
ATTORNEY

CONNECTOR SHEET WITH CONTACTS ON OPPOSITE SIDES

BACKGROUND OF THE INVENTION

The present invention is concerned with the provision contacts on opposite sides of a connector sheet which has a conductor secured only to one side of a foil. The connector sheets may be flexible printed circuits, or bands having flat conductors secured to one side. Connector sheets of this type have the advantage of low weight, small space requirements, and great mechanical strength. The so-called flat band cables consist of flat copper conductors bonded to a flexible foil band consisting of an insulating synthetic material, and being covered with a flexible insulating material.

In contrast to the flat band cable, which is manufactured, and later adapted by the user to the particular function, the flexible printed circuit represents a multilayered electronic circuit consisting of several parts. Flat band cables, and also flexible printed circuits, can be soldered by a soldering iron, or by other methods so as to be connected with each other.

Difficulties arise when printed circuits of this type are not to be permanently and rigidly connected by soldering. This problem develops for distributors which are to be used in different circuits, but also for flexible printed circuits in which the individual printed circuits of a stack are to be exchangeable. It is desirable that conductive contacts are established by only touching of corresponding conductors and connectors.

SUMMARY OF THE INVENTION

It is one object of the invention to provide a connector sheet with contact portions on opposite sides, and with conductors on only one side.

Another object of the invention is to obtain a connector sheet having contacts on both sides, by bending a marginal portion upon the main portion of a connector sheet.

Another object of the invention is to provide the connector sheet with contact portions on opposite sides for abutting corresponding contact portions of adjacent connector sheets forming a stack.

With these objects in view, a connector sheet according to the present invention, which may be card-like sheet, or an elongated band, comprises an insulating foil having a front surface and a rear surface, and being bent upon the rear surface along a fold line to form a main portion and a marginal portion abutting the rear surface of the main portion; and conductors secured to the front surface of the insulating foil and including at least one connector extending on the front surface across the fold line to the marginal portion. The connector has two contact portions located on the main portion and on the marginal portion, respectively, and in front and in the rear of the connector sheet, respectively.

Preferably, the marginal portion is bent along a perforated fold line. The connector or connectors which extend across the fold line are symmetrical to the same so that two contact portions at the end of each connector register with each other when the sheet is bent.

A plurality of superimposed connector sheets form a stack wherein the contact portions on confronting sides of two adjacent superimposed connector sheets register and abut each other to form a conductive connection between the conductors of the two adjacent connector sheets.

Preferably, clamping means act on the stack to press the abutting contact portions against each other, and the clamping means act on the marginal portions spaced from the fold line so that no pressure is exerted on the connectors where the same are bent at the fold line.

A particularly advantageous use of the connector sheets according to the invention is a magnetic data storage device which includes a stack of connector sheets. The design of the connector sheets of the invention corresponds substantially to the design of conventional punch cards. For each order, a hole is provided, and the holes of the sheets of a stack register with each other so that a ferrite core can pass through the registering holes. In a known arrangement, the holes are square, and contain the legs of U-shaped magnetizable cores. The magnetic flux of each U-shaped core is obtained by I-shaped yoke connecting the free ends of the legs of the U-shaped core. A read out winding is placed on the I-shaped yoke. The storage punch card has a plurality of rows of holes, each of which is surrounded by an annular printed conductor, and the same are connected along the row. In order to introduce information, each annular conductor surrounding the hole is punched on one side so that the annular conductor is interrupted. Thereby, an interrogation pulse can flow about a magnetizable core part in one direction, and on another part in the opposite direction. During flow in one direction around a hole, a pulse is generated in the read out winding of the respective core part, which may be considered as a L bit, while the flow in the opposite direction around the core part constitutes a 0 bit. The output lines of the rows of the card are connected to a plurality of output contacts provided on the card. The output conductors are also interrupted by punched holes, except one which is connected by the respective output contact with an electronic apparatus. In order to obtain a desired data sequence, an interrogation pulse is transmitted to the respective conductor row, and the information of the respective row is then available as a combination of L and 0 signals in the read out winding. Storage devices including a stack of punch cards with printed circuits are known, and are widely used.

Difficulties arise for the connection of the conductors on the cards with other apparatus. It is uneconomical and impractical to connect each card with a multiple plug to the other circuit. Therefore, it has been preferred to provide contacts on both sides of the cards so that by stacking and superimposing the cards, all connectors can be connected with a common multiple socket, which is connected by a multiple plug with the other parts of the circuit. The provision of contacts on both sides of the card increases the cost of the card substantially. Manual connections by soldered contacts is also expensive, and does not permit an exchange of cards which is frequently very desirable.

In accordance with the invention, storage punch cards which have conductors only on one side, can be stacked in any number, and the electric connection between the cards is obtained by simply pressing the cards of the stack together.

In accordance with the invention, all input and output conductors are connected with input and output contacts located on one side of the card, and the contacts are constructed in such a manner, that by bending a marginal portion of the card, contacts are formed on both sides of the card or connector sheet, for obtaining an electric connection between adjacent stacked cards. Preferably, the cards or connector sheets are stacked in such a manner that the marginal bent-over portion of cards of alternate sets project in opposite directions from the stack so that the thickness of the stack is the same in the regions of the end portions where the bent-over marginal portions are located, and in the center portion of the stack where only the remainders of the main portions of the cards are stacked.

The novel features which are considered as characteristic for the invention are set forth in particular in the appended claims. The invention itself, however, both as to its construction and its method of operation, together with additional objects and advantages thereof, will be best understood from the following description of specific embodiments when read in connection with the accompanying drawing.

DESCRIPTION OF THE PREFERRED EMBODIMENTS

Figure 1:
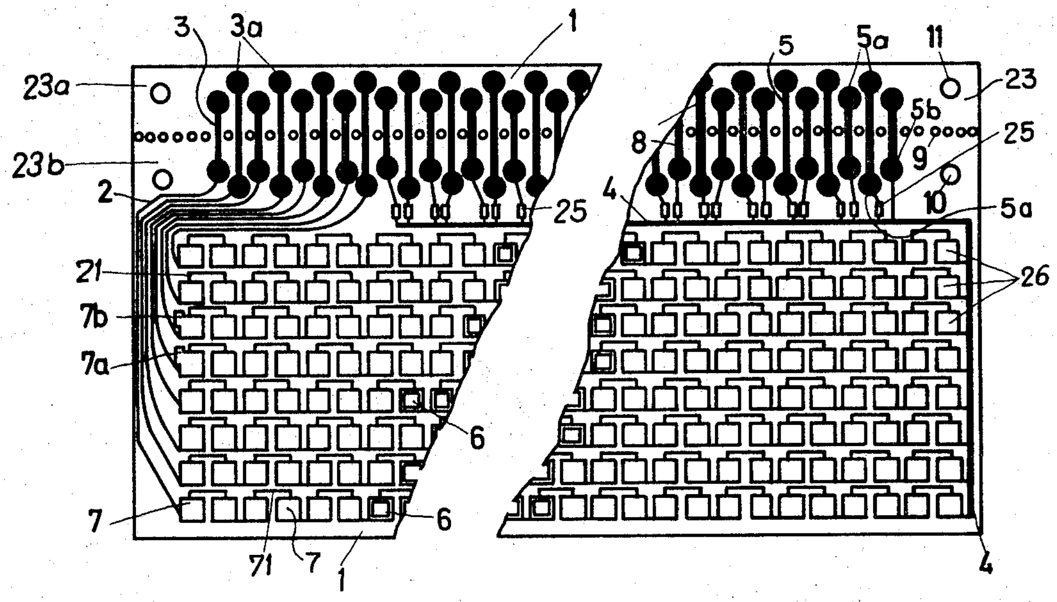
FIG. 1 is a top view illustrating a connector sheet according to the invention before bending of the marginal portion.
Figure 2:
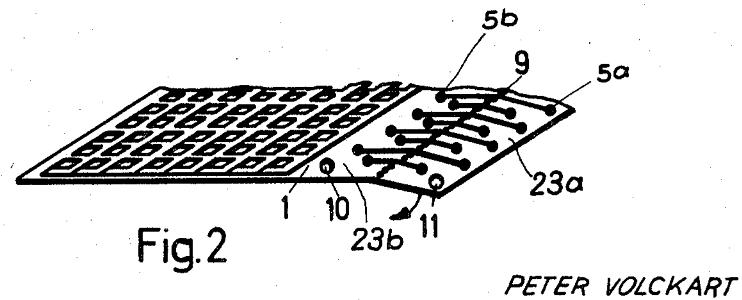
FIG. 2 is a fragmentary perspective view of a connector sheet as shown in FIG. 1.
Figure 3:
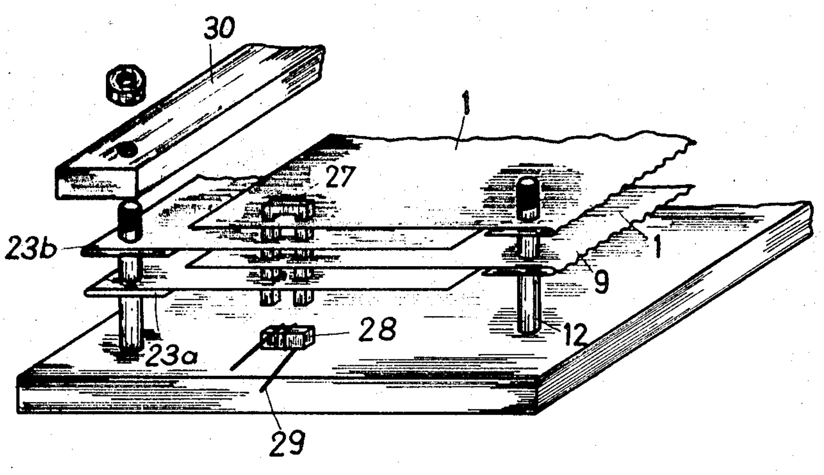
FIG. 3 is a fragmentary perspective view illustrating a stack of superimposed connector sheets.

Referring first to the embodiments of FIGS. 1 to 3, the connector sheets 1 according to the invention, are substantially punched cards and printed circuits. A plurality of input connectors 3, and a plurality of output connectors 5 are arranged in the upper region of the card, and each input connector 3 is connected by an input conductor 2 with a different conductor 21 which consists of annular conductors 7 connected by connecting portions 71. Each annular conductor portion 7 surrounds a square hole 22 in the card or connector sheet. The other ends of conductors 21 are connected with an output conductor means 4 and to the output connectors 5. All conductive elements of the connector sheets are attached to the same side of a supporting foil 23 which has a line of perforations 9 to which the input connectors 3 and the output connectors 5 are symmetrical. Each connector 3 and 5 has a narrow central portion 8 extending across the line of perforations 9, and two contact portions 3*a* and 5*a* at the ends thereof which are wider than the central portions of the connectors 3 and 5. When the marginal portion 23*a* of foil 23 is bent upon the rear face of the main portion 23*b*, a fold line forms along the line of perforations 9. Since the connectors 3 and 5 are symmetrical to the fold line, the contact portions 3a and 5a register, respectively, and are located on opposite sides of the card or connector sheet 1.

U-shaped ferrite cores 27 are inserted into registering holes 6 into directly adjacent rows 26 of holes 6. A row is selected by supplying a current to the respective connector 3.

In the initial condition of the connector sheet 1, connectors 5 are all connected with the output conductors 4. By forming punched holes 25, all output connectors 5 with the exception of the output connector 5b are separated from the output conductor 4 so that a desired conductor sheet or card 1 can be selected from a stack. The interruption of conductors by punched holes is carried out by means of a conventional punch, as is widely used for punched cards. The conductors of the printed circuit of connector sheet 1 are arranged so that they have the same dimensions and pattern as conventional punched cards so that the punch can be set for interrupting a conductor at the desired point.

As noted above, the annular conductor portion 7 is interconnected by conductors 71 to form a row. If an annular conductor 7 between an input conductor 2 and an output conductor 4 is interrupted by punching a lateral hole 7*a* or 7*b* in one of the annular conductors 7, the interrupted annular conductor permits the flow of current from the input conductor 2 in one or the other direction about the legs of the U-shaped ferrite core 27 inserted through the holes 6. A pulse is generated which is transmitted to the read out winding 29 on the I-shaped yoke 28 of the U-shaped core 27. In the card or connector sheet shown in FIG. 1, the annular conductor 7*a* will induce a pulse representing a 0 bit, and the interrupted annular conductor 7*b* will generate a pulse representing L in the same read out winding 29 since each of the two annular interrupted conductors surrounds another leg of the same U-shaped ferrite core 27. By punching extensions 7*a* and 7*b* into the annular conductors 7 of each row, the desired information is stored in the respective row. For each annular conductor 7, two interruptions can be obtained by punching, one representing a 0 bit information, and the other L bit information. If in the illustrated example, if the information of the row with the annular interrupted conductor 7*b* is desired, the third connector 3 from the left, and the first connector 5 from the right, has to be energized. A pulse flowing through the selected input conductor 2 flows through the conductors 21 of the third row from the top through the output conductor 4 and the respective connector 5. The desired information is available from the read out winding 29.

In order to store a great number of data, a plurality of connector sheets 1 is combined in a stack. The number of rows of conductors on each card, multiplied by the number of cards, constitutes the number of possible stored data of the stack of cards. However, it is necessary that all connectors 3 and 5 of the superimposed cards or connector sheets 1 are connected with a multiple plug so that all superimposed contacts of the same location are connected with a single contact of the multiple plug. In accordance with the prior art, this problem is solved by providing contacts penetrating the card and having contact areas on both sides of the cards, which cause a substantial increase of the production costs of the cards.

In accordance with the invention, the connectors 3 and 5 have the contact portions 3*a* and 5*a* provided symmetrical to the folding line 9, so that by folding the marginal portion 23*a* onto the rear face of the main portion 23*b* of the supporting foil 23, the pairs of contact portions 3*a* and 5a are located in registering positions on both sides of the card, connected by the narrower central portions of connectors 3 and 5. The beginning of the bending of the fold line 9 is shown in FIG. 2.

In order to obtain exact registering of the contact portions *3a* and *5a* of each of the connectors 3 and 5, guide holes 10 and 11 are provided in the foil 23 through which guide rods 12 are inserted so that all connector sheets 1 of a stack are exactly aligned, and also so that the contact portions *3a* and *5a* of the same connector 3 and 5 exactly register after the marginal portion *23a* has been bent along the fold line 9. At least one perforated hole 9 is placed between two adjacent central portions of connectors 3 and 5.

When the marginal portion *23a* is bent over, and the contact portions *3a* of each connector 3 register exactly, contacts portions *3a* and *5a* are provided on both sides of the connector sheet 1. The guide holes 10 and the guide holes 11 are also arranged symmetrically with the fold line so that they register when the marginal portion *23a* is bent over. After punching of the hold extensions *7a* and *7b* has been completed, a number of folded connector sheets can be combined in a stack, and guide rods 12 inserted through the superimposed guide holes 10 and 11 of each connector sheet. Guide rods 12 have thread at the upper ends so that the stack can be pressed together by clamping bars 30 on opposide sides of the stack located substantially along the line of the registering contact portions *3a* and *5a*, but spaced from the fold line 9 so that the central portions 8 of the connectors 3 and 5 are not subjected to pressure where they are bent along the fold line.

As shown in FIG. 3, alternate sets of connector sheets 1 are stacked in reversed positions so that the main portions of the connector sheets are directly superimposed, while the marginal bent-over portions project from the stack in opposite directions, and the contact portions of alternate sets of connector sheets cooperate with each other. In this manner, the thickness of the stack is the same in the central portion where the main portions *23b* are superimposed, as in the end portions of the stack where a part of the main portion and a marginal portion of each connector sheet are superimposed.

In a preferred embodiment of the invention, two different connector sheets are used for stacking, each of which has the connectors 3 and 5 and the respective input and output conductors 2 and 4 arranged mirror symmetrically which has considerable advantages during interrogation, since the interrogating pulses of each kind of connector sheet flow in the same direction to the respective conductor 21.

It may be mentioned that the U-shaped cores 27 are inserted with a correspondingly shaped carrier sheet from the top through the openings 6 to obtain magnetic connection with the armature yokes 28 below the stack of sheets. It is advantageous to resiliently mount the yokes 28 so that they abut on the legs of the U-shaped cores 27 and assure a good magnetic flux path through the core and yokes.

The invention is not limited to a card storage device data, as described with reference to FIGS. 1 to 3. In the same manner, coding and decoding devices can be constructed of stacks of cards in which pre-set information can be obtained.

Figure 4:
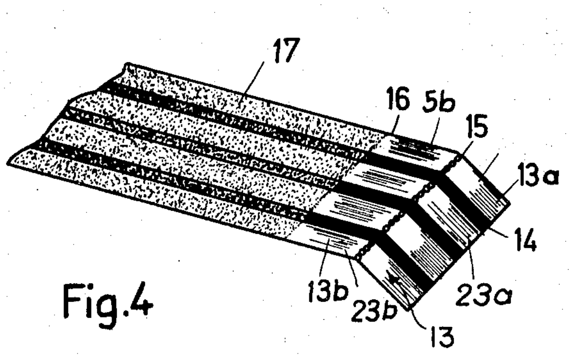
FIG. 4 is a perspective view illustrating a flat cable band in accordance with the invention.

FIG. 4 illustrates a flat band cable in accordance with the invention in which a supporting band foil 13 has on the front thereof elongated parallel conductors 14. The marginal end portion 13a of foil 13 is bent along the perforated fold line 15 to abut the rear face of the main portion *13b* of the foil 13 so that portion of the conductor strips 14 register and are available as contacts on both sides of the band. Starting from the line 16, the conductor strips 14 on the main portion *13b* are covered by a film of an insulating material 17.

It will be understood that each of the elements described above, or two or more together, may also find a useful application in other types of printed circuits differing from the types described above.

While the invention has been illustrated and described as embodied in a connector sheet having conductors on one side, and interconnected contacts on opposite sides formed of connectors bent along a fold line, it is not intended to be limited to the details shown, since various modifications and circuit changes may be made without departing in any way from the spirit of the present invention.

Without further analysis, the foregoing will so fully reveal the gist of the present invention that others can by applying current knowledge readily adapt it for various applications without omitting features that, from the standpoint of prior art, fairly constitute essential characteristics of the generic or specific aspects of this invention and, therefore, such adaptations should and are intended to be comprehended within the meaning and range of equivalence of the following claims.

What is claimed as new and desired to be protected by Letters Patent is set forth in the appended claims.

We claim:

1. A plurality of superimposed connector sheets forming a stack, each connector sheet comprising an insulating foil having a front surface and a rear surface, and being bent upon said rear surface along a foldline to form a main portion, and a marginal portion abutting said rear surface of said main portion; and conductors secured to said front surface of said insulating foil and including connectors extending on said front surface across said fold line to said marginal portion, each connector having a central portion located across said fold line, and two contact portions located on said main portion and on said marginal portion, respectively, said connectors of each contact sheet being disposed symmetrical to said fold line and being disposed so that said two contact portions of each contact sheet register with each other, and abut the contact portions of other connector sheets so that current can flow from the front and rear of each connector sheet to and from selected conductors of other contact sheets.

2. Connector sheet as claimed in claim 1 wherein the cross sectional area of said foil is smaller along a line so that said fold line forms along said line when said foil is being bent.

3. Connector sheet as claimed in claim 1 wherein said foil is perforated along a line so that said fold line forms along said line when said foil is being bent.

4. A plurality of superimposed connector sheets as claimed in claim 1 wherein each connector has said contact portions at the ends thereof; and wherein said contact portions are wider than the portion of said connector between said contact portions; and wherein said contact portions are disposed symmetrically to said fold line and have the same shape and area so as to exactly register with each other while being insulated from each other by said marginal portion and the part of said main portion of said foil covered by said bent marginal portion.

5. A plurality of connector sheets, each connector sheet comprising an insulating foil having a front surface and a rear surface, and being bent upon said rear surface along a fold line to form a main portion, and a marginal portion abutting said rear surface of said main portion; and conductors secured to the front surface of said insulating foil and including at least one connector extending on said front surface across said fold line to said marginal portion, each connector having two contact portions located on said main portion and on said marginal portion, respectively, and in the front and in the rear of the respective connector sheet so that current can flow from the front or the rear of each connector sheet to and from said conductors, said connector sheets forming a stack in which the parts of said main portions uncovered by said marginal portions are superimposed in a position in which said marginal portions and the parts of said main portion covered by said marginal portions project alternately in opposite direction; said connector of each connector sheet being located symmetrical to said fold line so that the two contact portions of each connector register with each other, and being disposed so that the contact portions of alternate connector sheets register and abut each other whereby the thickness of said stack is the same in the end regions and in the central region of said stack.

6. A plurality of superimposed connector sheets as claimed in claim 5 forming said stack, in combination with clamping means on opposite sides of said stack pressing said abutting contact portions against each other.

7. A plurality of superimposed connector sheets as claimed in claim 6 wherein said clamping means act on said marginal portions and on the parts of said main portions covered by said marginal portions in a region spaced from said fold line so that no pressure is exerted on said connectors where the same are bent at said fold line.

8. A plurality of superimposed connector sheets as claimed in claim 5 forming a stack, and wherein said superimposed connector sheets have holes in the respectively insulating foils of the same, said holes registering when said contact portions of adjacent contact sheets register to that by inserting guide rods into registering holes, said contact portions of the connector sheets of the entire stack are placed in exactly registering positions.

9. A plurality of superimposed connector sheets as claimed in claim 8 wherein said foil of each connector sheet has two of said holes in said marginal portion and in said main portion, respectively, disposed symmetrically to said fold line and registering with each other.

10. A plurality of connector sheets as claimed in claim 5 wherein each of said connector sheets has a plurality of said connectors having said two registering contact portions on opposite sides of said connector sheet; and wherein said connectors of each connector sheet are arranged in the same pattern so that said contact portions in the two end regions of said stack can be connected with two multiple plugs, respectively.

11. A plurality of connector sheets as claimed in claim 5 wherein each of said connector sheets has a plurality of said connectors having said two registering contact portions on opposite sides of the respective connector sheet; wherein said contact portions of each connector sheet include input and output contact portions; wherein said conductors include input and output conductors connected with said input and output contact portions, respectively; and wherein said input and output connectors and said input and output contact portions of alternate connector sheets are mirror symmetrical.

12. A plurality of connector sheets as claimed in claim 5 wherein each of said connector sheets has a plurality of said connectors having said contact portions; wherein said contact portions of each connector sheet include input and output contact portions; wherein said conductors of each connector sheet include input and output conductors connected with said input and output contact portions, respectively, and other conductors connecting said input and output conductors and including interconnected annular conductor portions surrounding registering holes in the part of said main portion which is uncovered by said marginal portion, selected annular conductor portions being interrupted at different points so that current flows in opposite directions through the same; and including magnetizable core means in said registering holes of said superimposed connector sheets, and read out winding means on said core means for generating L and 0 pulses depending on the direction of current flowing through said interrupted annular conductor portions.

13. A plurality of connector sheets as claimed in claim 5 wherein each foil is an elongated band; wherein said conductors include parallel elongated conductor strips on said front surface of said band; wherein the marginal end portion of each of said bands being bent upon the rear surface of the respective band along a fold line perpendicular to the longitudinal direction of said band with the conductor strip portions on said marginal end portion register with corresponding conductor strip portions on said main portion so that said registering conductor strip portions constitute connectors between registering contact portions in the front and rear of the connector sheet; and including an insulating film covering said conductor strips except said registering conductor strip portions.

* * * * *